(12) United States Patent
Hwang

(10) Patent No.: US 6,962,874 B2
(45) Date of Patent: Nov. 8, 2005

(54) METHOD FOR FABRICATING SEMICONDUCTOR DEVICE

(75) Inventor: Sung Bo Hwang, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/875,138

(22) Filed: Jun. 23, 2004

(65) Prior Publication Data

US 2005/0101122 A1  May 12, 2005

(30) Foreign Application Priority Data

Nov. 10, 2003  (KR) ...................... 10-2003-0079152

(51) Int. Cl.$^7$ .......................................... H01L 21/4763
(52) U.S. Cl. ...................... 438/636; 438/638; 438/687; 438/709; 438/633; 438/672
(58) Field of Search ................................ 438/636, 638, 438/687, 709, FOR 117, FOR 355, FOR 489, 438/633, 672

(56) References Cited

U.S. PATENT DOCUMENTS

| | | | |
|---|---|---|---|
| 5,741,626 A * | 4/1998 | Jain et al. .................... | 430/314 |
| 6,184,128 B1 * | 2/2001 | Wang et al. ................. | 438/637 |
| 6,372,631 B1 * | 4/2002 | Wang et al. ................. | 438/624 |
| 6,383,919 B1 * | 5/2002 | Wang et al. ................. | 438/638 |
| 6,429,121 B1 * | 8/2002 | Hopper et al. .............. | 438/636 |
| 6,432,814 B1 * | 8/2002 | Steiner et al. .............. | 438/624 |
| 6,656,837 B2 * | 12/2003 | Xu et al. ...................... | 438/676 |
| 6,699,784 B2 * | 3/2004 | Xia et al. ..................... | 438/637 |
| 2002/0000670 A1 * | 1/2002 | Yau et al. .................... | 257/759 |
| 2003/0008511 A1 * | 1/2003 | Tsai et al. .................... | 438/694 |

* cited by examiner

Primary Examiner—George Fourson
Assistant Examiner—Michelle Estrada
(74) Attorney, Agent, or Firm—Ladas & Parry LLP

(57) ABSTRACT

Disclosed is a method for fabricating a semiconductor device. The method comprises the steps of: sequentially forming a first anti-reflection layer and a first photoresist film on a substrate; forming a first image layer; forming a second anti-reflection layer and a second photoresist film; forming a second image layer which opens wider than the first image layer; supplying oxygen plasma to a resultant in order to transfer a pattern of the second image layer on the second anti-reflection layer and to transfer a pattern of the first image layer on the first anti-reflection layer, thereby forming an opening; forming a metal layer; forming a metal pattern to fill the opening; and removing the second image layer, the second anti-reflection layer, the first image layer, and the first anti-reflection layer.

5 Claims, 3 Drawing Sheets

METHOD FOR FABRICATING SEMICONDUCTOR DEVICE

BACKGROUND OF THE INVENTION

1. Field of the Invention

The present invention relates to a method for fabricating semiconductor devices, and more particularly to a method for fabricating semiconductor device, which include integrated circuit devices, photoelectronic devices, magnetic devices, optical devices, micro electromechanical devices (MEMS), etc., using a three-dimensional structure.

2. Description of the Prior Art

As generally known in the art, integrated circuit devices, photoelectronic devices, magnetic devices, optical devices, and the like are fabricated in a multi-layer structure having a micro pattern. In fabricating these devices having a multi-layer structure, in which a micro pattern is formed on each layer, a photolithography technique forming the micro pattern using light is typically used. In order to fabricate a device of a multi-layer structure by the photolithography technique, a plurality of masks (reticles) and mask aligning procedures are required.

That is, according to the photolithography technique, first, polymer material (for example, photoresist) having a high viscosity and reactivity to light is coated on a substrate, in which material to be patterned has been stacked (or deposited) on the substrate. Then, a reticle (mask) designed in a desired pattern is aligned at a predetermined alignment mark. Subsequently, an exposure process is performed by transmitting light to the polymer material, and the exposed polymer material is selectively removed through a development process, so that a pattern mask having the desired pattern is formed on the material to be patterned. After this, an etching process, a growth restraining process, an impurity implantation process, and the like are performed using the pattern mask. Through these processes, the material stacked on the substrate is patterned upon the desired pattern, or a doping region, in which impurities are implanted, is formed in a predetermined region of the substrate, thereby fabricating a semiconductor device.

Meanwhile, in the above-mentioned photolithography technique, a design rule (or a pattern design rule) in a circuit for a micro electromechanical device or the like is determined according to the wavelength of light used in the exposure process. Therefore, judging from the current technical level, it is very difficult to form an ultra-micro pattern, for example, a design rule of 0.1 micron or less, on a substrate using a photolithography process. That is, owing to refraction of exposing light, it is actually impossible to form a pattern having a width of 0.1 micron or less.

Meanwhile, users demand electronic apparatuses to be lighter, slimmer and smaller, so that it is required to manufacture ultra-micro devices or a highly integrated circuits (for example, DRAM, ASIC, etc.) having a pattern width of 0.1 micron or less. However, owing to limitation in a process technique, it is impossible to set a focus to a predetermined depth of thick photoresist, and photoresist may be damaged during a curing process, so that there is no way of satisfying the above-mentioned users' demand with the prior art.

SUMMARY OF THE INVENTION

Accordingly, the present invention has been made to solve the above-mentioned problems occurring in the prior art, and an object of the present invention is to provide a method for fabricating a semiconductor device of a three-dimensional structure using a stack structure, which has material including no photoactive material as well as photoresist including silicon and photoactive material.

In order to accomplish this object, there is provided a method for fabricating a semiconductor device, the method comprising the steps of: sequentially forming a first anti-reflection layer including no photoactive material and a first photoresist film including silicon/photoactive material on a silicon substrate; exposing and wet-developing the first photoresist film, thereby forming a first image layer having a predetermined shape; sequentially forming a second anti-reflection layer including no photoactive material and a second photoresist film including silicon/photoactive material on an entire surface of the substrate including the first image layer; exposing and wet-developing the second photoresist film, thereby forming a second image layer which opens wider than the first image layer; supplying oxygen plasma to a resultant structure in order to transfer a pattern of the second image layer on the second anti-reflection layer and to transfer a pattern of the first image layer exposed through the second anti-reflection layer on the first anti-reflection layer, thereby forming an opening; forming a metal layer on an entire surface of the substrate including the opening; performing a chemical-mechanical polishing process with respect to the metal layer, thereby forming a metal pattern to fill the opening; and removing the second image layer, the second anti-reflection layer, the first image layer, and the first anti-reflection layer.

Preferably, the first photoresist film is formed at a thickness of about 2000 Å, and the second photoresist film is formed at a thickness of about 3000 Å.

Preferably, the first anti-reflection layer is formed at a thickness of 1 to 100 $\mu$m.

Preferably, a step of removing the second image layer, the second anti-reflection layer, the first image layer, and the first anti-reflection layer is performed using a polar organic solvent.

Preferably, a baking process is additional performed after each of the first and the second anti-reflection layer is formed.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
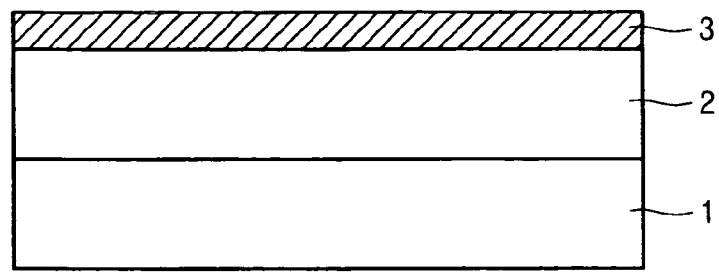
FIGS. 1 to 8 are sectional views for explaining a method of fabricating a semiconductor device according to one embodiment of the present invention.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 1 to 8 are sectional views for explaining a method of fabricating a semiconductor device according to one embodiment of the present invention.

That is, FIGS. 1 to 8 show a procedure of forming a metal pattern by using a stack structure which has a first material (an anti-reflection layer) including no photoactive material and a second material (a photoresist film) including silicon/photoactive material.

According to the method of the present invention for fabricating a semiconductor device, as shown in FIG. 1, a first anti-reflection layer 2 and a first photoresist film 3 including silicon and photoactive material are sequentially formed on a silicon substrate 1. Herein, the first anti-reflection layer 2 is formed with material including no photoactive material, and may includes additive, such as novolac, so as to increase viscosity. In addition, the first anti-reflection layer 2 is formed at a thickness of 1 to 100 $\mu$m, and the first photoresist film 3 is formed at a thickness of about 2000 Å.

Figure 2:
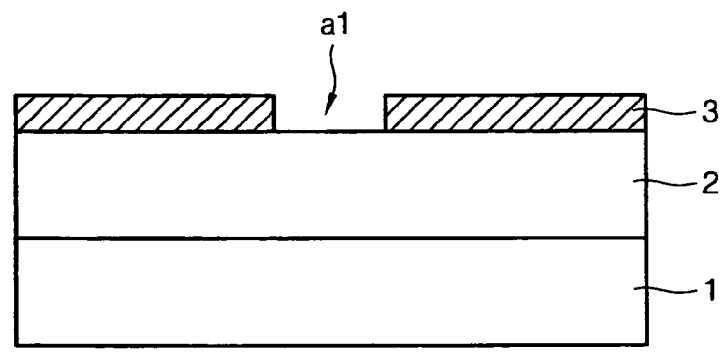

Subsequently, as shown in FIG. 2, the first photoresist film is exposed and wet-etched, thereby forming a first image layer 3a which has a first opening a1 of a predetermined shape.

Figure 3:
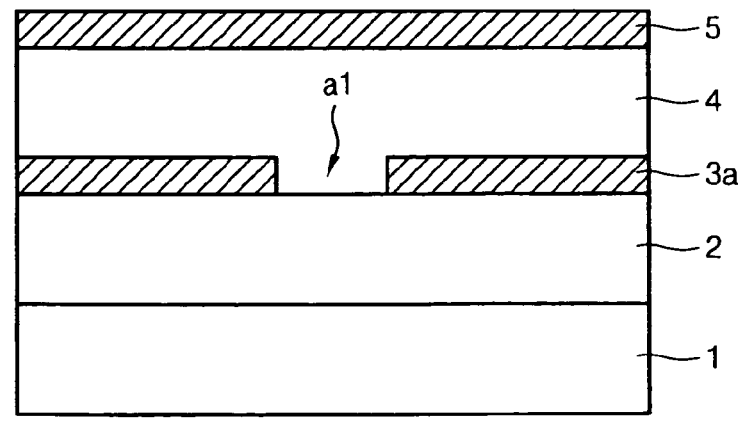

Next, as shown in FIG. 3, a second anti-reflection layer 4 and a second photoresist film 5 are sequentially formed on an entire surface of the substrate including the first image layer 3a. Herein, similarly to the first anti-reflection layer 2, the second anti-reflection layer 4 is formed with material including no photoactive material, and may includes additive, such as novolac, so as to increase viscosity. In addition, the second photoresist film 5 is formed at a thickness of about 3000 Å.

The anti-reflection layers including no photoactive material are formed through a plurality of steps, for example two step in the present invention. In addition, after an anti-reflection layer is formed, a baking process is additionally performed.

Figure 4:
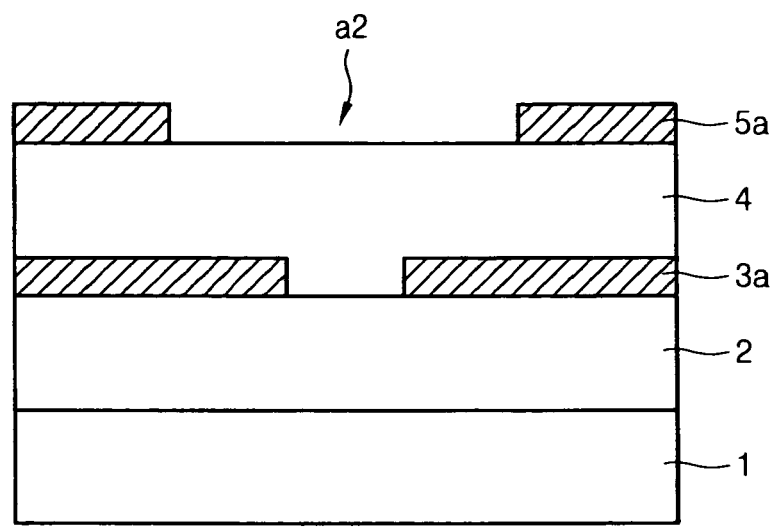

After this, as shown in FIG. 4, the second photoresist film is exposed and wet-etched, thereby forming a second image layer 5a. Herein, the second image layer 5a includes a second opening a2, which has a size larger than the first opening a1 of the first image layer 3a.

Figure 5:
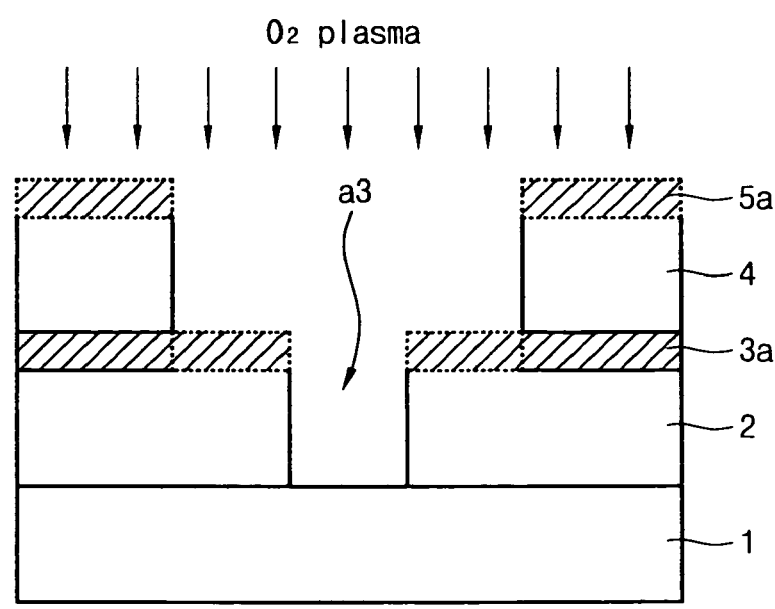

Subsequently, as shown in FIG. 5, an oxygen plasma process is performed with respect to the resultant structure including the second opening a2. As a result of the oxygen plasma process, the pattern of the second image layer 5a is transferred on the second anti-reflection layer 4, the pattern of the first image layer 3a exposed through the second anti-reflection layer 4 is transferred on the first anti-reflection layer 2, thereby forming a third opening a3 having a three-dimensional shape. Herein, during the oxygen plasma process, the second image layer 5a is transferred into a silicon oxide layer, so as to function as a hard mask.

Meanwhile, in FIG. 5, portions of the first and second image layers indicated by dotted lines represent regions processed by oxygen plasma.

Figure 6:
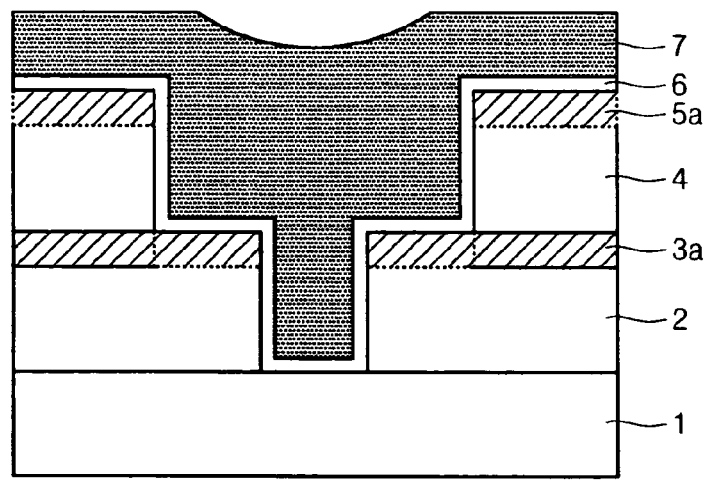

Next, as shown in FIG. 6, a diffusion barrier and a copper layer are sequentially formed on an entire surface of the substrate including the third opening a3. Herein, the copper layer is formed through an electrolytic plating method.

Figure 7:
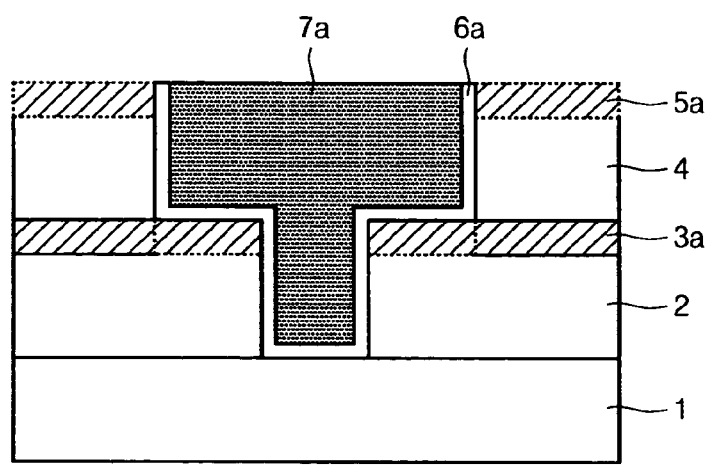

After this, as shown in FIG. 7, the copper layer and the diffusion barrier are sequentially subjected to until the second image layer is exposed, thereby forming a metal pattern.

Figure 8:
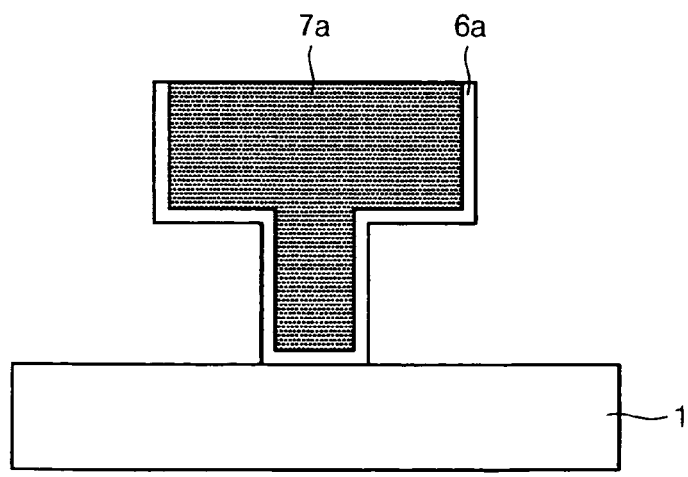

Subsequently, as shown in FIG. 8, the second image layer, the second anti-reflection layer, the first image layer, and the first anti-reflection layer are sequentially removed using a polar organic solvent, so as to leave a copper pattern and the diffusion barrier on the substrate 1.

Meanwhile, in a method for fabricating a semiconductor device according to the present invention, it is possible to use a lift-off method instead of the electrolytic plating method. According to the lift-off method, first, a metal layer for physical vapor deposition is deposited on a substrate using a physical vapor deposition method. Next, while the second image layer, the second anti-reflection layer, the first image layer, and the first anti-reflection layer are sequentially removed using a polar organic solvent, the metal layer for physical vapor deposition located on the layers is removed.

As described above, according to a method for fabricating a semiconductor device of the present invention, a metal pattern is formed using a stack structure which has a first material (an anti-reflection layer) which includes no photoactive material and a second material (a photoresist film) which includes silicon/photoactive material, so that it is possible to reduce manufacturing costs, as compared with the prior art, which uses only materials which include silicon/photoactive material of a high viscosity and a high price. In addition, according to the fabricating method of the present invention, the depths of openings and the like can be easily controlled, thereby increasing the yield rate of micro electromechanical devices (MEMS).

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device, the method comprising the steps of:
   sequentially forming a first anti-reflection layer including no photoactive material and a first photoresist film including silicon/photoactive material on a silicon substrate;
   exposing and wet-developing the first photoresist film, thereby forming a first image layer having a predetermined shape;
   sequentially forming a second anti-reflection layer including no photoactive material and a second photoresist film including silicon/photoactive material on an entire surface of the substrate including the first image layer;
   exposing and wet-developing the second photoresist film, thereby forming a second image layer which opens wider than the first image layer;
   supplying oxygen plasma to a resultant structure in order to transfer a pattern of the second image layer on the second anti-reflection layer and to transfer a pattern of the first image layer exposed through the second anti-reflection layer on the first anti-reflection layer, thereby forming an opening;
   forming a metal layer on an entire surface of the substrate including the opening;
   performing a chemical-mechanical polishing process with respect to the metal layer, thereby forming a metal pattern to fill the opening; and
   removing the second image layer, the second anti-reflection layer, the first image layer, and the first anti-reflection layer.

2. The method as claimed in claim 1, wherein, the first photoresist film is formed at a thickness of about 2000 Å, and the second photoresist film is formed at a thickness of about 3000 Å.

3. The method as claimed in claim 1, wherein, the first anti-reflection layer is formed at a thickness of about 1 to 100 $\mu$m.

4. The method as claimed in claim 1, wherein a step of removing the second image layer, the second anti-reflection layer, the first image layer, and the first anti-reflection layer is performed using a polar organic solvent.

5. The method as claimed in claim 1, further comprising steps of performing a baking process after each of the first and the second anti-reflection layer is formed.

\* \* \* \* \*